(12) United States Patent
Silveira et al.

(10) Patent No.: US 12,272,575 B2
(45) Date of Patent: *Apr. 8, 2025

(54) ADVANCED TEMPERATURE CONTROL FOR WAFER CARRIER IN PLASMA PROCESSING CHAMBER

(71) Applicant: Applied Materials, Inc., Santa Clara, CA (US)

(72) Inventors: Fernando M. Silveira, Livermore, CA (US); Chunlei Zhang, Santa Clara, CA (US); Phillip Criminale, Livermore, CA (US); Jaeyong Cho, Mesa, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/381,565

(22) Filed: Oct. 18, 2023

(65) Prior Publication Data

US 2024/0047246 A1 Feb. 8, 2024

Related U.S. Application Data

(63) Continuation of application No. 15/217,513, filed on Jul. 22, 2016, now Pat. No. 11,837,479.

(Continued)

(51) Int. Cl.
*H01L 21/67* (2006.01)
*C23C 16/46* (2006.01)
(Continued)

(52) U.S. Cl.
CPC ........ *H01L 21/67248* (2013.01); *C23C 16/46* (2013.01); *C23C 16/50* (2013.01);
(Continued)

(58) Field of Classification Search
CPC ......... C30B 25/00; C30B 25/02; C30B 25/10; C30B 25/12; C30B 25/16;
(Continued)

(56) References Cited

U.S. PATENT DOCUMENTS

| 5,186,238 A | 2/1993 | del Puerto et al. |
| 6,247,678 B1 | 6/2001 | Hines et al. |

(Continued)

FOREIGN PATENT DOCUMENTS

| CN | 102907180 | 1/2013 |
| CN | 103930843 | 7/2014 |

(Continued)

OTHER PUBLICATIONS

Official Letter from Taiwan Patent Application No. 112106923 dated Nov. 8, 2023, 5 pgs.

(Continued)

*Primary Examiner* — Kenneth A Bratland, Jr.
(74) *Attorney, Agent, or Firm* — Schwabe, Williamson & Wyatt, P.C.

(57) ABSTRACT

An advanced temperature control system and method are described for a wafer carrier in a plasma processing chamber. In one example a heat exchanger provides a temperature controlled thermal fluid to a fluid channel of a workpiece carrier and receives the thermal fluid from the fluid channel. A proportional valve is between the heat exchanger and the fluid channel to control the rate of flow of thermal fluid from the heat exchanger to the fluid channel. A pneumatic valve is also between the heat exchanger and the fluid channel also to control the rate of flow of thermal fluid from the heat exchanger and the fluid channel. A temperature controller receives a measured temperature from a thermal sensor of the carrier and controls the proportional valve and the (Continued)

pneumatic valve in response to the measured temperature to adjust the rate of flow of the thermal fluid.

7 Claims, 7 Drawing Sheets

Related U.S. Application Data

(60) Provisional application No. 62/332,237, filed on May 5, 2016.

(51) Int. Cl.
  *C23C 16/50* (2006.01)
  *C23C 16/505* (2006.01)
  *C23C 16/52* (2006.01)
  *C23C 16/56* (2006.01)
  *H01J 37/32* (2006.01)

(52) U.S. Cl.
  CPC ............ *C23C 16/505* (2013.01); *C23C 16/52* (2013.01); *C23C 16/56* (2013.01); *H01J 37/32715* (2013.01); *H01J 37/32724* (2013.01); *H01J 37/3299* (2013.01); *H01L 21/67017* (2013.01); *H01L 21/67103* (2013.01); *H01L 21/67109* (2013.01)

(58) Field of Classification Search
  CPC ......... H01L 21/67248; H01L 21/67017; H01L 21/67103; H01L 21/67109; H01L 21/67; C23C 16/46; C23C 16/50; C23C 16/505; C23C 16/52; C23C 16/56; H01J 37/32715; H01J 37/32724; H01J 37/3299
  USPC ..... 117/84–86, 105, 200–202; 118/715, 722, 118/723 R, 724–725; 156/345.1, 345.24, 156/345.27; 427/569
  See application file for complete search history.

(56) References Cited

U.S. PATENT DOCUMENTS

| | | | |
|---|---|---|---|
| 6,672,561 | B2 | 1/2004 | Kerg et al. |
| 7,649,729 | B2 | 1/2010 | Buchberger, Jr. et al. |
| 8,608,900 | B2 | 12/2013 | Buchberger, Jr. et al. |
| 8,822,876 | B2 | 9/2014 | Tavassoli et al. |
| 8,916,793 | B2 | 12/2014 | Silveira et al. |
| 8,970,114 | B2 | 3/2015 | Busche et al. |
| 9,267,742 | B2 | 2/2016 | Bera et al. |
| 9,984,908 | B2 | 5/2018 | Kobayashi et al. |
| 11,837,479 | B2 * | 12/2023 | Silveira ............. H01J 37/32724 |
| 2004/0187787 | A1 | 9/2004 | Dawson et al. |
| 2007/0204610 | A1 | 9/2007 | Hatta |
| 2008/0197317 | A1 | 8/2008 | Schwiegel |
| 2009/0114158 | A1 | 5/2009 | Zucker et al. |
| 2010/0018648 | A1 * | 1/2010 | Collins ............. H01J 37/32642 156/345.24 |
| 2011/0186545 | A1 | 8/2011 | Mahadeswaraswamy et al. |
| 2013/0105084 | A1 * | 5/2013 | Mahadeswaraswamy ................... C23C 16/463 165/96 |
| 2014/0262199 | A1 | 9/2014 | Kobayashi et al. |
| 2015/0107268 | A1 | 4/2015 | Han et al. |
| 2015/0179485 | A1 | 6/2015 | Hiroki |
| 2016/0071755 | A1 | 3/2016 | Park et al. |
| 2016/0196954 | A1 | 5/2016 | Goto |

FOREIGN PATENT DOCUMENTS

| | | |
|---|---|---|
| CN | 204831788 | 12/2015 |
| JP | S5375550 | 7/1978 |
| JP | H06502353 A | 3/1994 |
| JP | H08335567 A | 12/1996 |
| JP | 2000-320696 | 7/2001 |
| JP | 2007-537360 | 12/2007 |
| JP | 2009-015594 | 1/2009 |
| JP | 2009117443 A | 5/2009 |
| JP | 2011-155170 | 8/2011 |
| JP | 2013-519192 | 5/2013 |
| JP | 2013-522883 | 6/2013 |
| JP | 2013-534695 | 9/2013 |
| JP | 2013-536539 | 9/2013 |
| JP | 2015-079930 | 4/2015 |
| KR | 10-0765983 | 10/2007 |
| KR | 10-2010-0108323 | 10/2010 |
| KR | 10-2011-0071125 | 6/2011 |
| KR | 10-2012-0130175 | 11/2012 |
| KR | 10-2015-0086511 | 7/2015 |
| TW | 201339781 | 10/2013 |
| WO | WO 2004/025199 | 1/2006 |
| WO | WO 2007/148850 | 12/2007 |

OTHER PUBLICATIONS

International Search Report and Written Opinion from PCT/US2017/022828, dated Jun. 26, 2017, 16 pgs.
International Preliminary Report on Patentability from PCT/US2017/022828 mailed Nov. 15, 2018, 13 pgs.
Non-Final Office Action from U.S. Appl. No. 15/217,512 dated Jun. 18, 2019, 28 pgs.
Final Office Action from U.S. Appl. No. 15/217,513 dated Oct. 7, 2019, 27 pgs.
Notice of Reasons for Rejection from Japanese Patent Application No. 2018-557807 dated Oct. 29, 2019, 9 pgs.
Notice to File a Response from Korean Patent Application No. 10-2018-7035049 dated Feb. 8, 2020, 8 pgs.
Non-Final Office Action from U.S. Appl. No. 15/217,513 dated Mar. 2, 2020, 29 pgs.
Notice of Reasons for Rejection from Japanese Patent Application No. 2018-557807 dated Mar. 31, 2020, 4 pgs.
Final Office Action from U.S. Appl. No. 15/217,513 dated Jul. 1, 2020, 31 pgs.
Official Letter from Taiwan Patent Application No. 106109667 dated Aug. 20, 2020, 9 pgs.
Non-Final Office Action from U.S. Appl. No. 15/217,513 dated Oct. 20, 2020, 32 pgs.
Preliminary Rejection from Korean Patent Application No. 10-2020-7027075 dated Oct. 28, 2020, 9 pgs.
Office Action from Taiwan Patent Application No. 106109667 dated Jan. 19, 2021, 4 pgs.
Final Office Action from U.S. Appl. No. 15/217,513 dated Feb. 12, 2021, 34 pgs.
Non-Final Office Action from U.S. Appl. No. 15/217,513 dated Apr. 8, 2021, 16 pgs.
Preliminary Rejection from Korean Application No. 10-2021-7015864 dated Jul. 16, 2021, 5 pgs.
Notice of First Office Action from Chinese Patent Application No. 201780027652.6 dated Aug. 10, 2021, 19 pgs.
Final Office Action from U.S. Appl. No. 15/217,513 dated Aug. 17, 2021, 24 pgs.
Notice of Reasons for Rejection from Japanese Patent Application No 2020-146769 dated Nov. 11, 2021, 11 pgs.
Non-Final Office Action from U.S. Appl. No. 15/217,513 dated Dec. 13, 2021, 19 pgs.
Preliminary Rejection from Korean Patent Application No. 10-2021-7015864 dated Feb. 7, 2022, 6 pgs.
Official Letter from Taiwan Patent Application No. 106109667 dated Feb. 17, 2022, 10 pgs.
Final Office Action from U.S. Appl. No. 15/217,513 dated Apr. 19, 2022, 19 pgs.
Notice of Final Rejection ("1st final rejection") from Korean Patent Application No. 10-2021-7015864 dated Aug. 1, 2022, 5 pgs.
Non-Final Office Action from U.S. Appl. No. 15/217,513 dated Aug. 8, 2022, 22 pgs.
Final Office Action from U.S. Appl. No. 15/217,513 dated Feb. 3, 2023, 22 pgs.

(56) References Cited

OTHER PUBLICATIONS

Notice of Reasons for Rejection from Japanese Patent Application No. 2022-111301 dated Jul. 26, 2023, 10 pgs.
Official Letter from Taiwan Patent Application No. 113104659 dated Jul. 4, 2024, 6 pgs.
Notice of Reasons for Rejection from Japanese Patent Application No. 2024-003804, dated Feb. 4, 2025, 12 pages.

* cited by examiner

ADVANCED TEMPERATURE CONTROL FOR WAFER CARRIER IN PLASMA PROCESSING CHAMBER

CROSS-REFERENCE TO RELATED APPLICATIONS

This application is a Continuation of U.S. patent application Ser. No. 15/217,513, filed Jul. 22, 2016, which claims benefit of U.S. Patent Application No. 62/332,237, filed May 5, 2016, the entire contents of which are hereby incorporated by reference herein.

FIELD

Embodiments relate to the microelectronics manufacturing industry and more particularly to a thermal control system that uses a thermal fluid circulation system to control the temperature of a wafer carrier or a wafer in a processing chamber.

BACKGROUND

Microelectronic and micromechanical devices are typically fabricated in part on a silicon or other type of wafer. When finished, the wafer is diced into many smaller pieces and each die forms a separate device. The wafer is subjected to many different processes to form all of the components on the device. For many of the processes, the wafer is held on a chuck, pedestal or some other carrier within a processing chamber. One such chamber is a plasma processing chamber within which the wafer is exposed to a plasma to deposit or remove different materials.

In a plasma processing chamber, such as a plasma etch or plasma deposition chamber, the temperature of the wafer and the wafer carrier is often an important parameter that controls the effectiveness or speed of a process. For example, the temperature of a chuck can be controlled to heat or cool the wafer during a process recipe. The temperature may be changed to particular set points during a process to affect the process in some way such as to control an etch rate. Similarly, the temperature of a showerhead or an upper electrode or other component may also be controlled during the process recipe to influence the processing.

More accurate temperature control provides more accurate control over processes, such as deposition, and etching. As microelectronic features are made smaller so that dies and the resulting products can be made smaller, more precision is required during manufacturing in the process chamber. In addition higher power plasmas generate more heat and require more effective cooling. As a result, the temperature control system must be more accurate and operate over a wider range to support many different processes.

Processing chamber components are cooled by circulating a fluid through coolant channels in the component. The amount of cooling is controlled by controlling the temperature of the coolant and the flow rate of the coolant through the component. In some cases, for example for some wafer chucks, a warm fluid is also used to heat the chuck and thereby the wafer. The warm fluid may be driven through the same coolant channels or using a separate system. Electric resistive heaters may also be used in the wafer chuck in addition to or instead of the coolant.

SUMMARY

A thermal control system is described that uses a proportional and pneumatic thermal fluid delivery control system. In one example the apparatus includes a heat exchanger to provide a thermal fluid to a fluid channel of a workpiece carrier and to receive the thermal fluid from the fluid channel, the heat exchanger to control the temperature of the thermal fluid provided to the thermal channel, the thermal fluid in the fluid channel to control the temperature of the carrier during workpiece processing. A proportional valve is between the heat exchanger and the fluid channel to control the rate of flow of thermal fluid from the heat exchanger to the fluid channel. A pneumatic valve is also between the heat exchanger and the fluid channel also to control the rate of flow of thermal fluid from the heat exchanger and the fluid channel. A temperature controller receives a measured temperature from a thermal sensor of the carrier and controls the proportional valve and the pneumatic valve in response to the measured temperature to adjust the rate of flow of the thermal fluid.

A thermal control system is described that uses closed loop control and a predictive model to control the temperature of a wafer carrier. A measured temperature is received from a first thermal sensor of the first thermal zone and a second thermal sensor of a second thermal zone of the carrier. A predictive model is applied to both of the measured temperatures to determine a first flow rate through a first fluid channel of the carrier thermally coupled to the first thermal zone and to determine a second flow rate through a second fluid channel of the carrier thermally coupled to the second thermal zone. A first valve coupled to the first fluid channel is modulated and a second valve coupled to the second fluid channel is modulated to control a rate of flow of thermal fluid from a heat exchanger to the respective fluid channels.

BRIEF DESCRIPTION OF THE DRAWINGS

Embodiments of the present invention are illustrated by way of example, and not limitation, in the figures of the accompanying drawings in which.

DETAILED DESCRIPTION

A system is described that may be used in a wFib (water interface box) or any other type of fluid flow control system of a microelectronic wafer processing system. The wFib as described herein together with a digital controller provides continuous digital control of temperature through a combination of a continuous or proportional valve and a digital or pneumatic valve. The valves are connected in series between a heat exchanger with a pump and an electrostatic chuck or other wafer support.

The valves may be controlled using any of a variety of different processes including open loop, closed loop, predictive, or iterative processes. While the system is described primarily for use in a plasma chamber with an electrostatic chuck for semiconductor processing, the same techniques may be used to control any surface temperature in a semiconductor chamber that uses a fluid to heat or to cool the surface.

The described embodiments may be operated with closed loop temperature control systems. A pulsing mode may be used on a pneumatic valve for low flow mode control. This overcomes the hysteresis of proportional valves. The proportional valve may be used for general control to overcome the low reliability of the pneumatic valve. The described system has a lower serviceability cost.

The temperature of a workpiece support, such as an electrostatic chuck (ESC) or vacuum chuck may be controlled using a proportional fluid delivery system or with a pulsing fluid delivery system. The proportional valve provides a gradual analog adjustment to the flow rate. The pulsing valve quickly cycles a fluid valve open and closed to produce an average flow rate that depends on the amount of time during which the valve is open. The valves determine the amount of fluid which flows to the chuck. The flow rates allowed by a proportional valve meet the cooling demands of plasma processes with high bias RF power. For cooler processes or when less flow is desired, the pulsing valve allows for precise control of low flow rates.

Hybrid Valve Configuration

Figure 1:
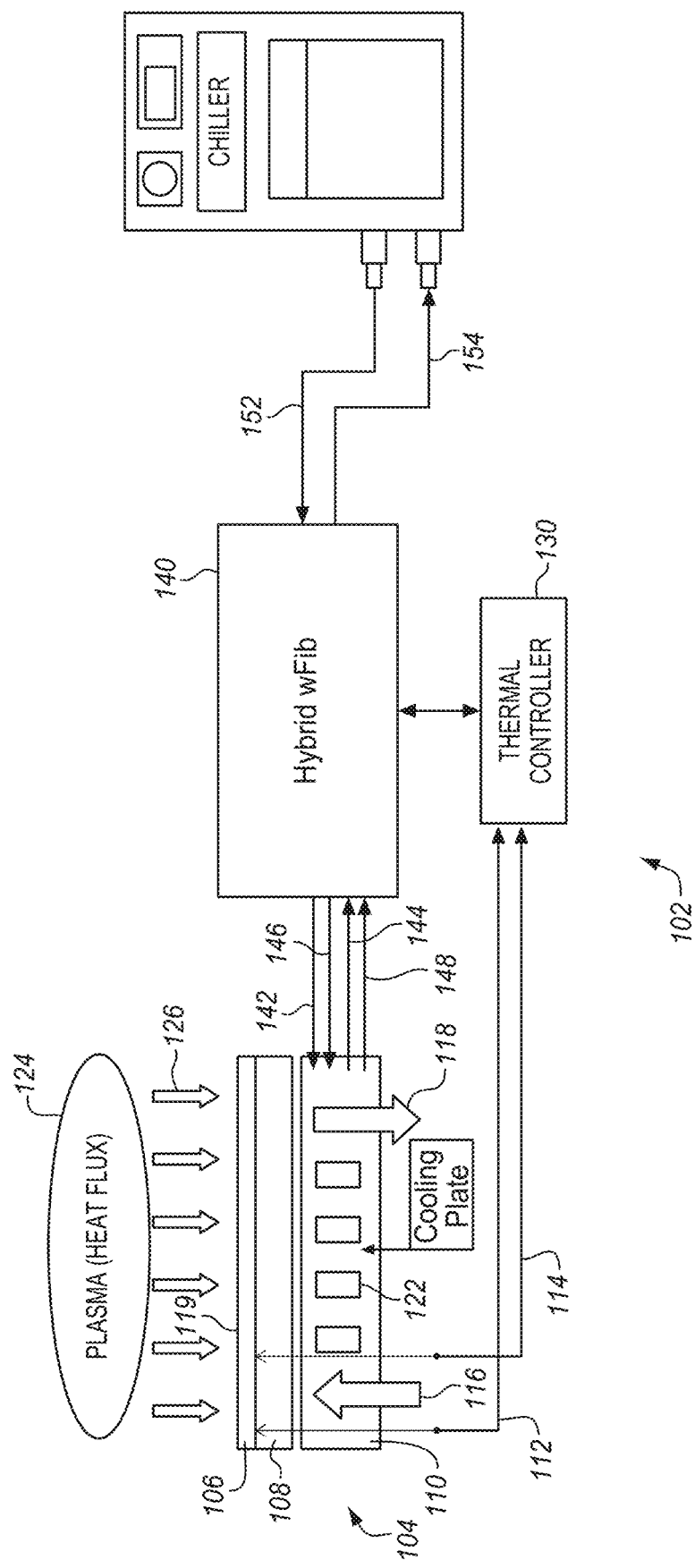
FIG. 1 is a diagram of a two zone temperature control system for an electrostatic chuck in accordance with an embodiment of the invention.

FIG. 1 is a diagram of a two zone temperature control system 102 for an electrostatic chuck 104 that supports a workpiece 106 in a plasma 124 processing chamber. A hybrid wFib (water interface box) 140 is designed to have both proportional and pneumatic valves. A thermal controller 130, such as a MIMO (Multiple Input Multiple Output) controller or any other type of controller may be used to apply a thermal control process to control the valves and regulate the temperature of the chuck or the workpiece carried by the chuck. The controller 130 takes a temperature reading from multiple probes 112, 114 of the chuck 104 as feedback to control the temperature of the chuck as well as its ramp rate.

The chuck 104 has an upper plate 108 to carry a workpiece 106 such as a silicon wafer or other type of substrate. The upper plate is supported by a cooling plate 110. There are other supports below the cooling plate (not shown) to move and support the workpiece and to provide gases, electrical current, and other materials to the upper plate and the workpiece. During some fabrication processes, heat 126 is applied to the workpiece from a plasma 124. The workpiece may also be heated by other elements and components within the processing chamber including heaters in the chuck. The heat is conducted, at least in part, through the workpiece to the upper plate and to the cooling plate. The upper plate has thermal probes 112, 114 to measure the temperature at or near the workpiece.

The cooling plate 110 has coolant channels 122 that receive coolant in inlet channels 116 and that release the coolant through output channels 118. The arrows show a single inlet and outlet for simplicity, however, there may be multiple independent channels, each with an inlet and an outlet. This allows the temperature of different parts of the cooling plate to be independently controlled. As an example, the periphery of the chuck tends to get hotter than the center of the chuck. A separate peripheral or outer fluid channel allows more coolant to be applied to the periphery of the chuck.

While the present description describes the workpiece carrier in the form of an ESC in the context of a plasma processing chamber, the ESC described herein may be used in a variety of different chambers and for a variety of different processes. A different substrate carrier may be used instead of an ESC, depending on the particular implementation.

Figure 2:
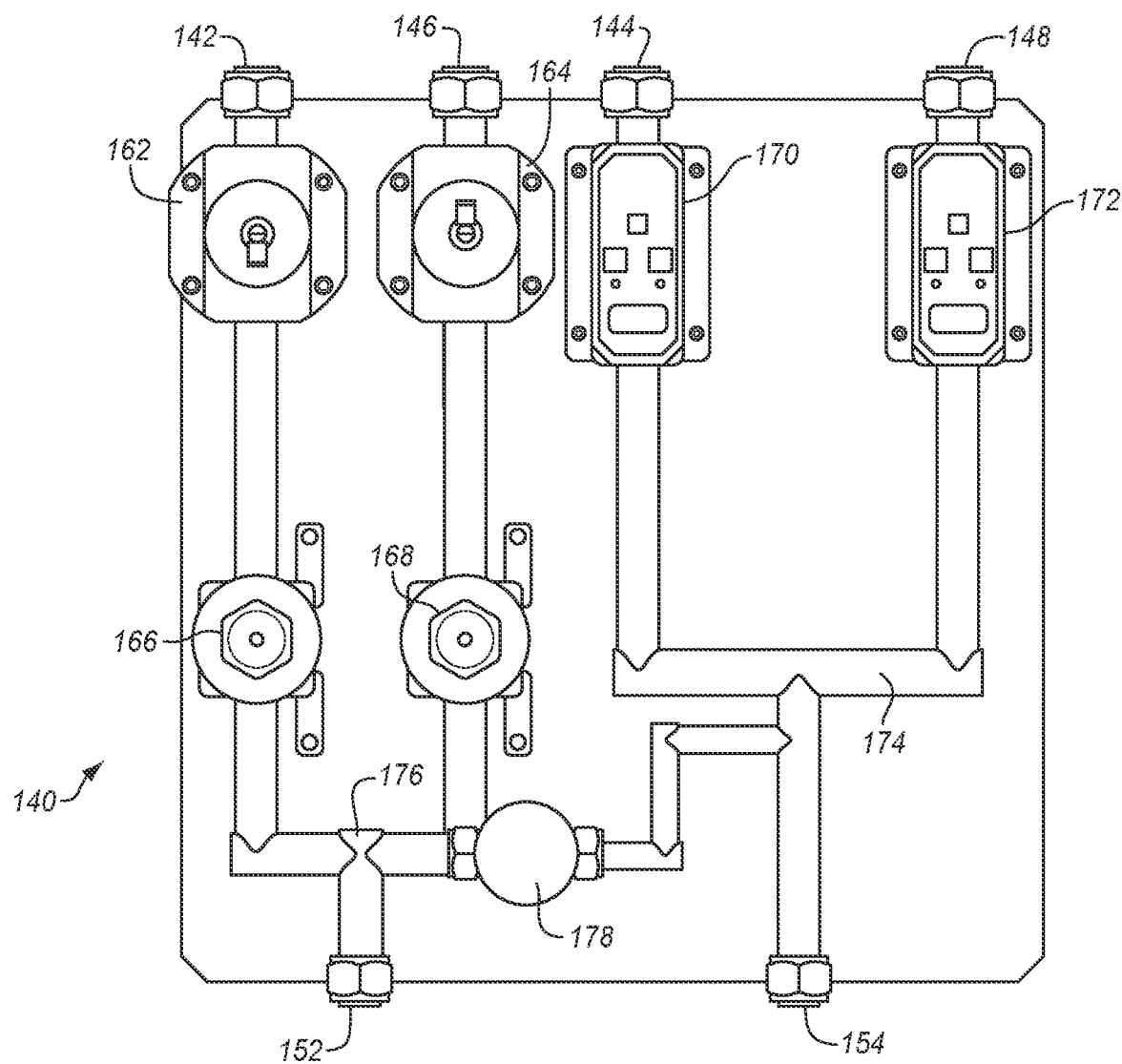
FIG. 2 is a diagram of coolant fluid lines within a water interface box accordance with an embodiment of the invention.

The present diagram shows a two zone or two loop system with two independent coolant flow zones. The wFib 140 has a single fluid input 152 and a single output 154 from the heat exchanger but produces two separate fluid outputs 142, 146 to the chuck. These may be independently controlled within the wFib and are fed to the independent coolant channels in the chuck. The fluid is returned from each independent channel as two separate and independent return lines 144, 148 from the chuck. The two return lines may be combined at any point after exiting the chuck. In this example, as shown in FIG. 2, the return flow rate is monitored within the wFib. To monitor each loop independently, the return loops are kept separate until the lines are measured. While two loops are shown, the described system may be expanded to include 3, 4, 6, or more temperature control zones.

Figure 4:
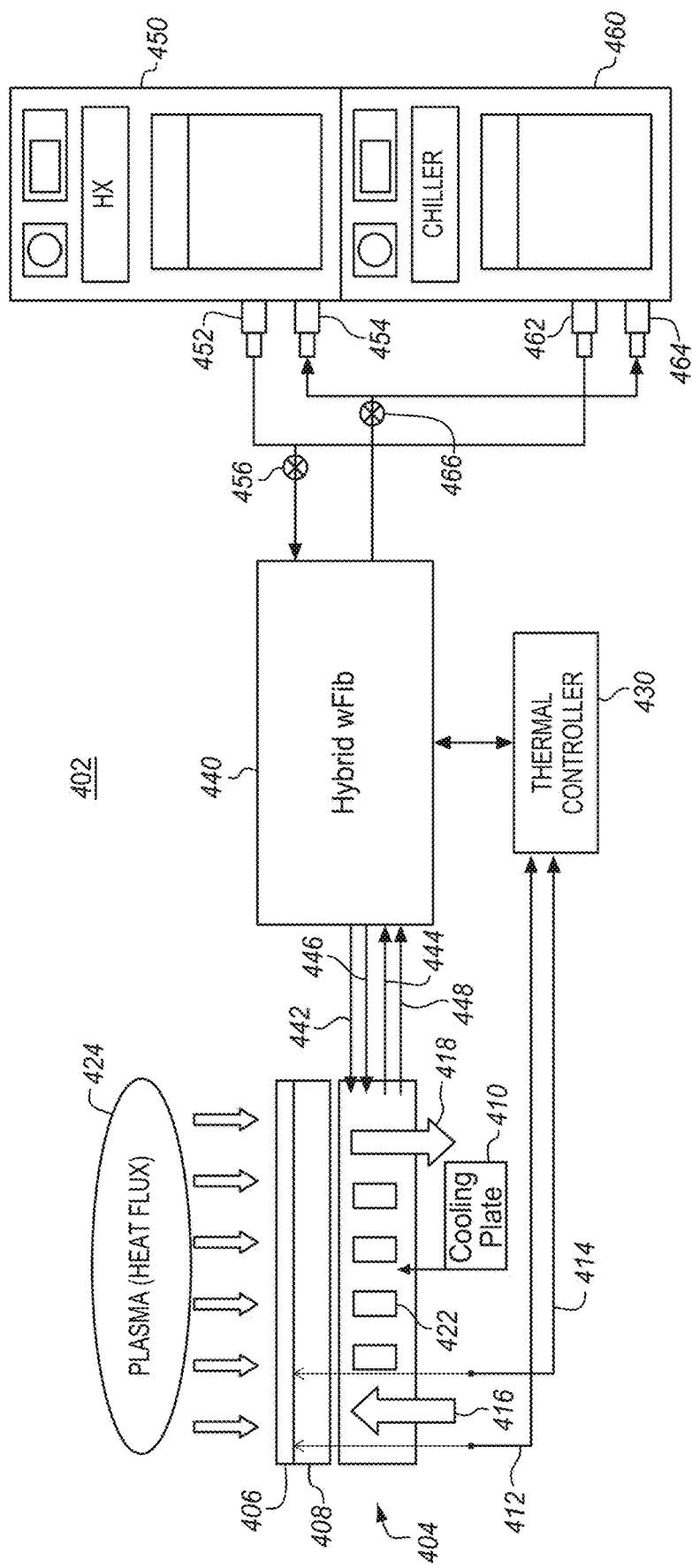
FIG. 4 is a diagram of a two zone temperature control system for an electrostatic chuck in accordance with an embodiment of the invention.

The heat exchanger provides a source 152 and a return 154 for cool fluid for the chuck. A second heat exchanger (not shown) may be used as a heat source as shown in FIG. 4. The heat exchanger receives the return fluid and cools it to a predetermined temperature or by a regulated amount. The heat exchanger may be thermostatically controlled or it may apply a fixed amount of cooling based on the design with or without any specific control. The temperature of the coolant that is circulated through the chuck 104 or any other workpiece carrier, as described below, is controlled in part by the temperature of the supplied cold fluid and also by the flow rate of the fluid through the chuck in each coolant loop.

The temperature controller 130 receives a temperature signal from thermal sensors 112, 114, such as optical temperature probes, that are attached to a workpiece in a process chamber or to the chuck or carrier 122 to determine the temperature of the substrate either directly or indirectly. Based on this received temperature, the controller opens and closes valves in the wFib 140 and controls the flow rate through the carrier 104 coolant channels 122. The temperature controller may generate valve control signals, for example analog voltages, digital PWM (Pulse Width Modulated) signals, or pneumatic signals and supplies these signals to the wFib which contains the valves as show in FIG. 2. The controller also receives pressure, temperature and other signals from the wFib. The wFib controls the valves to open or close the passageways from the heat exchanger to the chuck. A higher flow rate allows the fluid to transfer more heat from the carrier.

FIG. 2 is a diagram of coolant fluid lines within the wFib 140 of FIG. 1. There may be many other components within the wFib not shown here for simplicity. In addition, the controller 130 may be incorporated into the wFib. While the wFib is referred to as a water interface box, the coolant is typically not water but another material with a higher boiling point such as such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers.

A proportional valve can continuously adjust flow. A pneumatic valve can act as a shut off valve and can act as a pulsing valve for flow rate control in a PWM mode. As shown, the heat exchanger coolant fluid supply line 152 is supplied as an input to the wFib 130. The supply is provided to a tee 176 to split the supply into two parts. These parts are used to supply coolant to the two outputs 142, 146 of the wFib to supply coolant to the two coolant channels of the chuck. The two lines each have a pneumatic valve 166, 168 and a proportional valve 162, 164 coupled in series so that the output of each pneumatic valve is coupled to an input of a respective proportional valve. The output of the proportional valve is coupled to the respective coolant output line 142, 146. Alternatively, the order of the valves may be reversed so that the proportional valve is coupled directly to the input and the pneumatic valve is coupled to the output.

While only two coolant lines are shown from the tee 176, more coolant lines may be supported by using additional tees or by using a fluid distribution manifold with more output lines than the two lines shown for the tee. There may also be pressure compensation, adjustment, and distribution components (not shown) within the manifold to control the amount of pressure supplied from the heat exchanger input 152 into each pneumatic valve, respectively.

The return lines 144, 148 from the chuck cooling plate are each coupled to a respective flow meter 170, 172 which may be used to measure the pressure and flow rate of the return fluid. Temperature may also be measured. The flow meter and optional temperature values may be used by the controller 130 to control the heat exchanger and the valves. After measuring flow, the return fluid is combined in a return manifold 174, in this case a simple tee, that returns the fluid to the heat exchanger return line 154.

In this example, the flow control valves 162, 164, 166, 168 are on the supply side between the heat exchanger output and the wafer carrier. The same effect may be achieved by instead placing the valves on the return side between the wafer carrier and the return input 154 of fluid back into the heat exchanger. As a further alternative, valves may be placed in both places or one type of valve, pneumatic or proportional, may be placed on one side of the wafer carrier and the other type of valve may be placed on the other side of the wafer carrier. Similarly, the flow meters may be placed on either side of the wafer carrier or at another place in the system. In some embodiments, the flow meters are at the heat exchanger. In the illustrated example, the flow meter measurements may be combined with flow data from the corresponding heat exchanger.

The temperature controller 130 controls the valves 162, 164, 166, 168 to achieve the desired flow rate through the chuck. The proportional valves 162, 164 may be controlled through an electro-pneumatic regulator. Such a regulator is supplied with a CDA (Compressed Dry Air) at a controlled and typically constant pressure. The regulator regulates the input CDA to produce a precise pneumatic air pressure signal in response to an electrical control signal from the thermal controller. If a stepless analog signal is provided to the regulator, then the regulator may provide a regulator air pressure that also varies steplessly. This regulated pneumatic control pressure is applied to the pressure regulated valve to open and close the fluid channel of the valve.

In some embodiments, the CDA is applied to an air supply solenoid valve of the regulator 140. As the input control voltage from the controller increases, the solenoid valve opens. The pressure released through the air supply valve is measured by a sensor and fed to a control circuit. The air supply valve is adjusted until the measured pressure aligns with the pressure indicated by the control signal. An exhaust solenoid valve is provided to relieve pressure within the regulator back to the CDA supply.

The pressure regulated valve provides proportional fluid control in response to the control pressure from the pressure regulator. This allows for a stepless control of the fluid flow through each coolant flow line 142, 146. The valve moves very little compared to a pulsed valve. This provides a longer hardware life with less servicing. In addition, the response to temperature changes is smoother. Using a variable flow-rate with no continuous fluid off times during plasma processing, the temperature response is smoother and temperature oscillations are reduced.

On the other hand, the proportional valve does not provide precise variations in flow at lower flow rates. The pneumatic valves 166, 168 may be pulsed to add precision to the flow rate control when lower flow rates are desired.

Additional valves (not shown) may be used in the fluid return channels 144, 148 to provide additional control of flow rates through each channel. A further bypass valve 178 may be used to allow fluid to flow through the heat exchanger without flowing through the carrier. When the pneumatic or proportional valves 162, 164, 166, 168 are closed, the incoming supply fluid is blocked from flowing through the wFib outlets 142, 146. If the bypass valve 178 between the wFib inlet 152 and outlet 154 is open, then the supplied fluid flow instead directly back to the return line 154 bypassing the processing chamber. This allows the corresponding heat exchanger to establish a steady temperature and keep the supply of fluid at the desired temperature. Additional valves may be used to further control flow directions.

Figure 3:
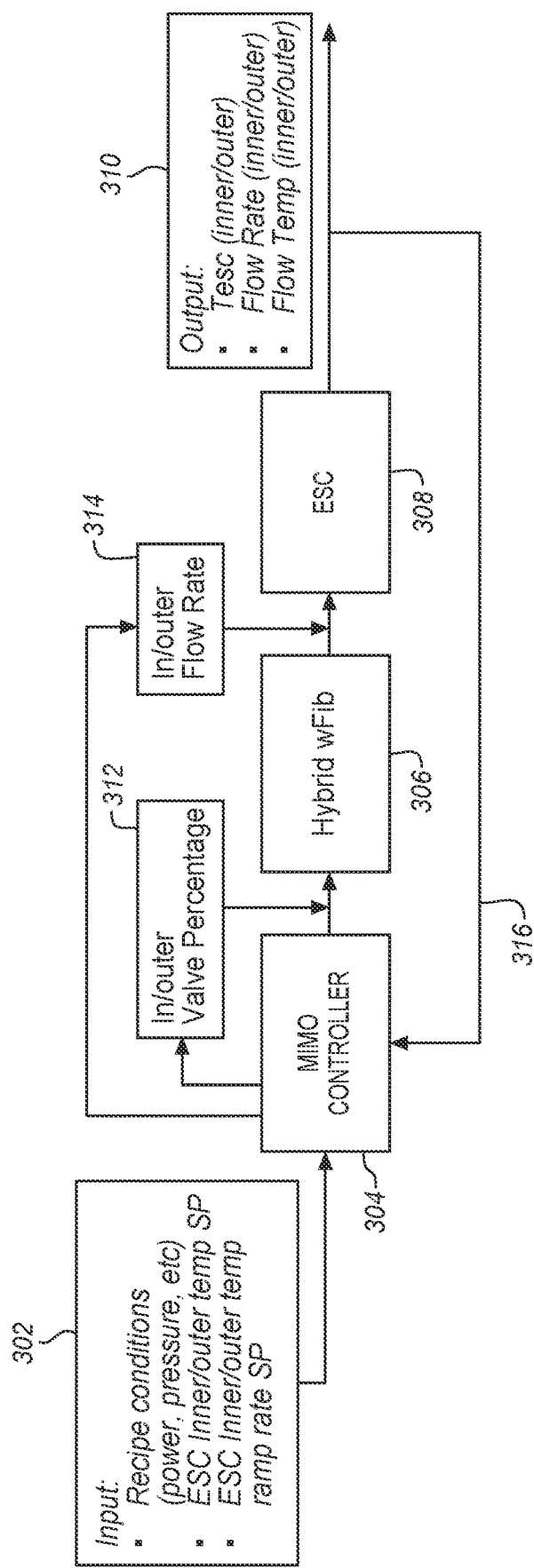
FIG. 3 is a diagram of controlling the valves and the heat exchanger temperature of a water interface box in accordance with an embodiment of the invention.

FIG. 3 is a diagram of controlling the valves and the heat exchanger temperature. The control system has multiple inputs 302 which may include recipe conditions (based on the process being applied to the workpiece and including power, pressure, etc., the inner and outer temperature of the chuck as measured by the various temperature sensor probes (SPs), and the chuck inner and outer temp ramp rate from the SPs.

The outputs 310 may include the intended inner and outer channel temperatures of the electrostatic chuck, Tesc, the inner and outer channel flow rates of the chuck, and the inner and outer flow temperatures of the chuck.

These multiple inputs 302 are applied to a MIMO controller 304 which then operates the valves. The inputs may be used in any of a variety of different ways to determine how to operate the valves. The inputs, ESC temp, various SP values, and recipe conditions, are taken together with feedback on a line 316 from the ESC 308 to control the ESC temperature. In some embodiments, the temperature ramp rate, or rate of temperature change may also be controlled using the valves. In the illustrated example, the controller generates an inner and outer channel valve percentage 312 which determines the valve opening percentage for the pneumatic and proportional valves. The inner and outer valve percentages are applied to the wFib 306. The controller also determines an inner and outer channel flow rate 314 which is compared to the measured flow rates at the wFib. The fluid is then circulated through the ESC 308. The outputs 310 from the ESC are then returned in a closed loop back to the controller to further determine new valve percentages 312 and flow rates 314.

In this example, there are two separate fluid channel zones 122 in the ESC. These are designated as inner and outer. The temperature and flow rate of the fluid of each zone is independent of the temperature and flow rate in the other zone. For this reason, there are two independent flow supply lines 142, 146, two independent fluid return lines 144, 148, two independent sensor probes 112, 114, and two independent series of valves 162, 166, 164, 168. Each zone is independently monitored and controlled, however the control process may be managed in a MIMO controller 304. While the zones are referred to as inner and outer, they may be in any desired relative physical position in the ESC. There may be more zones as well by providing for additional separate coolant channels in the ESC and the related components.

Temperature ramp rates may be used to improve ESC reliability, for example the bonding life time. Temperature ramp rate control also helps with matching processes between different processing chambers that have different thermal characteristics. Control over the temperature ramp rate also helps to improve the process window for HARC (High Aspect Ratio Contact) etching and other processes that require high precision.

In the illustrated example, the valve percentages 312 are applied to the wFib, however, this depends on the configuration and control system for the valves. The percentages may be in the form of digital or analog control signals that are received by a separate valve controller that then sends a pneumatic or electric signal to the respective valves. The valve controller may be in the wFib or in another location. A PLC (Programmable Logic Controller) within the wFib or in a separate chassis may be used to control both the proportional and the pneumatic valves. The operations may be extended to control electric resistive heaters within the chuck and also to control a heated fluid supply as shown in FIG. 4. These additional thermal systems provide more temperature control knobs for the system which allows for greater control over the chuck and workpiece temperature and its ramp rate.

FIG. 4 is a diagram of a two zone temperature control system 402 for an electrostatic chuck 404 in a plasma 424 processing chamber. This system has dual chillers or heat exchangers 450, 460 to provide both cooling and heating functions using the fluid channels of the chuck. The dual chiller/heat exchanger facility provides hot or cold fluid flow depending on the request of the chamber temperature controller 430.

Similar to the example of FIG. 1, a workpiece 406 is attached to a carrier 404, such as an ESC. A plasma 424 applies heat to the workpiece during certain stages of the fabrication processes. The ESC in this example has a top plate 408 with temperature sensor probes 412, 414 and a lower cooling plate 410 with two zones of coolant channels, although there may be more. The coolant channels have input lines 416 coupled to fluid outputs 442, 446 of a wFib 440. The coolant channels have outputs 418 coupled to the return lines 444, 448 back to the wFib. While only two coolant channels are shown for two thermal zones on the ESC there may be more just as there may be more in the example of FIG. 1.

The temperature regulation system has a hot fluid heat exchanger 450 with a source output line 452 and return input line 454 for hot or heated fluid. The return feeds the fluid back to the heat exchanger. The heat exchanger heats the fluid to a predetermined temperature or heats the fluid by a regulated amount and provides the fluid under pressure to the supply line 452. The fluid temperature may be fixed or it may be adjusted based on a control signal, for example a control signal from the controller 430 or another controller. Similarly the system has a source or output line 462 and a return line 464 for cool or cooled fluid for a second heat exchanger 460. The second heat exchanger 460 receives the cool return fluid and cools it to a predetermined temperature or by a regulated amount. The first and second heat exchangers may be a single unit or two separate devices, as shown. The heat exchangers may be thermostatically controlled or they may apply a fixed amount of heating or cooling with or without any specific control, depending on the particular embodiment. The temperature of the coolant that is circulated through the substrate carrier 404 is controlled in part by the temperature of the supplied hot 452 and cold 462 fluids but also by the flow rate and the mixture of hot and cold fluids that reaches the ESC 404.

The hot fluid supply is provided to a 3-way valve 456 which opens or closes the flow of hot fluid from the heat exchanger. The cold fluid supply is similarly provided to the same 3-way valve which opens or closes the flow of cold fluid from the second heat exchanger. Fluid that is allowed through this valve is provided to the wFib 440 in a wafer carrier supply line which regulates the flow rate in the same way as the wFib of FIG. 1 using pneumatic and proportional valves connected in series. The coolant with the regulated temperature then heats or cools the workpiece carrier. There is an additional optional 3-way valve 466 coupled to the hot and cold return lines 454, 464. Fluid from the substrate carrier is returned in a return line to this valve and allowed to pass through this valve back to the respective heat exchanger from which the fluid came. The 3-way valves are operated under the control of the temperature controller 430 that is coupled to the two valves. The 3-way valves may be included in the wFib or they may be in some external chassis or fixture.

In some embodiments, the temperature controller 430 determines the flow rate and heat exchanger to use, to either heat or cool the thermal fluid, in the substrate carrier fluid channels. In some embodiments, the coolant fluid provided by the cold heat exchanger is at about 0° C. and the coolant fluid provided by the hot heat exchanger is at about 55° C. Depending on the current temperature of the wafer carrier, either one or a mixture of these fluids is delivered to the fluid channel. As an example, the carrier temperature is above the set point, then the fluid from the cold chiller is used. If the temperature is below the set point, then the fluid from the hot chiller is used. The fluid delivery system controls the temperature at the workpiece to within an appropriate temperature range. The fluid delivery system also controls temperature ramp up and overshoot during plasma processing.

Return paths (not shown) may be provided for the two heat exchangers to allow heated fluid to flow from the hot supply 452 to the hot return 454 bypassing the workpiece carrier 404 and optionally the wFib 440. FIG. 2 shows an example of such a return path that is opened using a valve 178. A similar cool fluid return valve may be used to allow cooled fluid to flow from the cool supply 462 to the cool return 464 directly without passing through the carrier. When either the hot or the cold supply is not supplied to the carrier because of the settings of the 3-way valves 456, 466 the hot and cold fluid return valves may be used to allow fluid to flow through the corresponding heat exchanger without flowing through the carrier. This allows the corresponding heat exchanger to establish a steady temperature and keep the supply of fluid at the desired temperature.

The described temperature regulation system allows the temperature of fluid flowing through the channels in the substrate carrier to be controlled with a range of, for example, 0° C. to 55° C. The workpiece carrier may have more than one thermal fluid channel in which case, the system of FIG. 4 may be duplicated to support each additional channel. Because the mixture into the wFib and the flow rate through the coolant channels may be independently controlled, a single hot and a single cold heat exchanger may be used to provide fluid to more than one channel.

Figure 5:
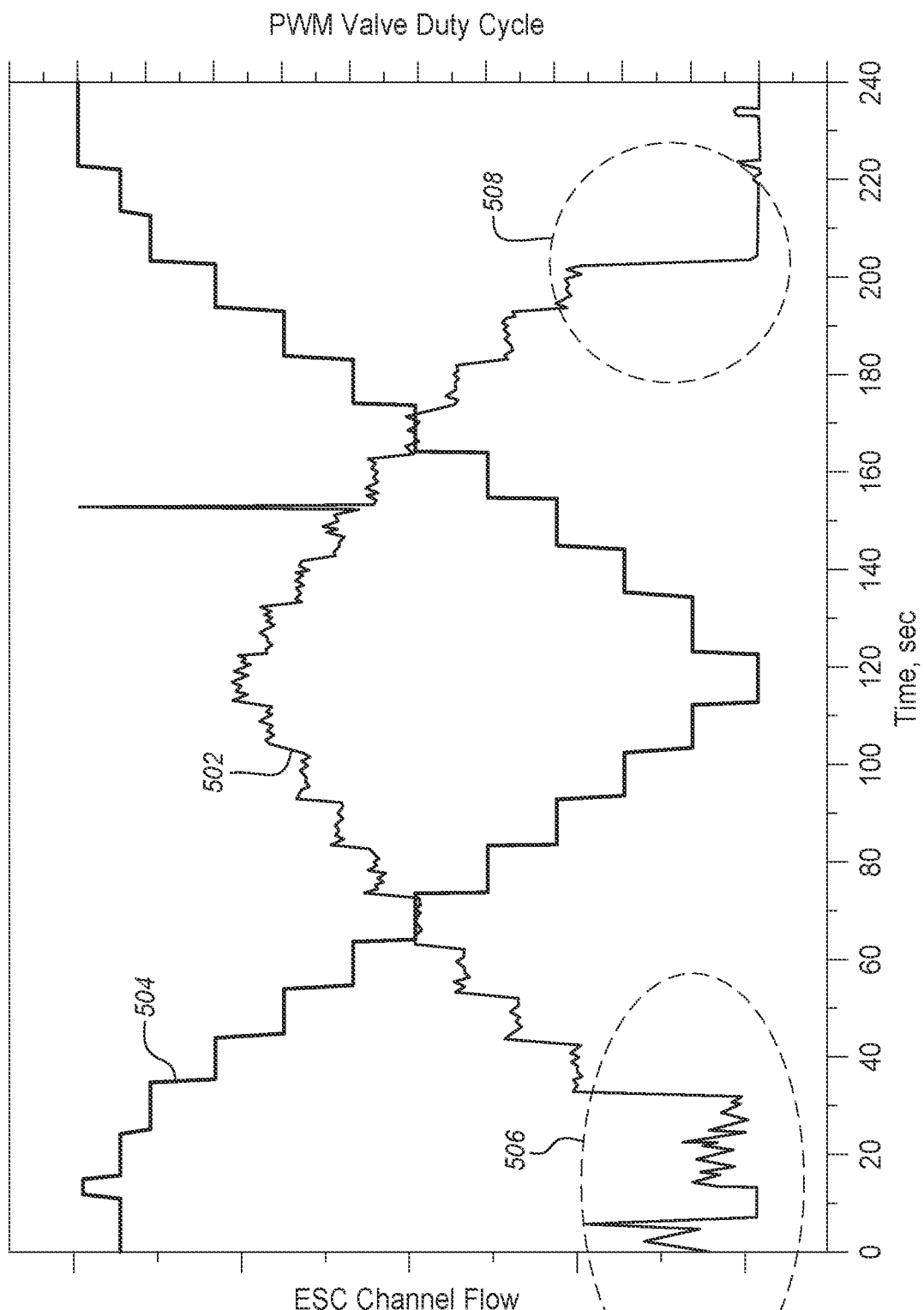
FIG. 5 is a diagram of flow rates through proportional valves of a water interface box at different valve percentages in accordance with an embodiment of the invention.

FIG. 5 is a diagram of flow rates through the proportional valve at different valve percentages. There is a first upper curve 504 to show different control inputs to the proportional valve over time on the horizontal axis. The vertical axis for the first curve represents a duty cycle of a PWM waveform applied to the valve as shown on the scale on the right. A higher duty cycle as shown at the left and right ends of the diagram closes the valve. A low duty cycle, as shown near the center of the diagram, allows the valve to be more open.

A second curve 502 shows a flow rate through the proportional valve in response to the applied PWM signal 504. The vertical scale for flow rate on the left is from lower flow rates at the bottom of the scale to higher flow rates at the top of the vertical scale. As shown, when the valve is first opened up and flow is slowly increased by lowering the PWM duty cycle, there is an area 506 of low flow through the proportional valve. In this area, the valve does not have a consistent linear and repeatable response to the input signal 504. The flow rate in this area 506 is erratic. Similarly when the valve is closed down from a high flow rate at the center of the diagram to a low flow rate, the valve has an area 508 as the valve is closed within which the valve response is also not linear or repeatable. In this example, the flow rate suddenly drops to a minimum and does not recover. At the same time outside of these low flow areas 506, 508, the proportional valve is regular and has a predictable response to the input signal.

The diagram of FIG. 5 represents a typical response for a proportional valve. In order to overcome this non-linear response, the wFib with two valves in series may be operated in a different way than a conventional single valve. In embodiments, the proportional valve is the primary valve for higher flow rates and is operated within the linear region and not in the end low flow areas 506, 508. To achieve low flow rates, the proportional valve is closed down to a low flow rate area that still has a predictable response. The flow rate is then lowered further by operating the pneumatic valve. This allows for high precision in the low flow rate areas. For higher flow rates, the proportional valve is used and the pneumatic valve is not used at all. This reduces wear on the pneumatic valve while still providing precise control over the flow.

Control Methodology

The embodiments above include a valve controller 130, 430. The valve controller may control the valves in a different ways, depending on the embodiment. In some embodiments, a MIMO (multiple input multiple output) model-based controller may be used. The MIMO controller may be used to respond to sensor probe (SP) temperature readings during wafer processing and then to control temperature ramping rates (both ramping down and ramping up). The ramping rate is an important parameter for some processes. As an example, the ramping rate may affect the bonding reliability in some processes. While the system is described primarily for use in a plasma chamber with an electrostatic chuck for semiconductor processing, the same techniques may be used to control any surface temperature in a semiconductor chamber that uses a fluid to heat or to cool the surface.

The described model-based MIMO system may be used to control the temperature ramping rate as well as to manage zone-to-zone cross talk. Zone-to-zone cross talk occurs when the temperature of one zone affects the temperature in another zone, for example due to heat flow through the plate of the ESC that contains the fluid channels. Control software may be extended to control wafer temperature by extending the model-based design to a wafer temperature model in addition to an electrostatic chuck temperature model. As a result, the described embodiments may serve to improve the overall temperature matching within a chamber, the electrostatic chuck's bond lifetime, and the process window The multiple inputs 302, described in FIG. 3, may be applied to a MIMO controller 304, 130, 430 which has a model-based design. The inputs ESC temp, various SP temperature values, and recipe conditions may be taken together with feedback on a line 316 from the ESC 308 to control the ESC temperature as well as its ramp rate. The controller applies the model to generate the inner and outer channel valve percentages 312 and additional channels for the total number of zones in the system.

The model-based determination relies on a physical model of the heat absorption and heat transfer characteristics of components of the system. These components may include one or more of the chuck, the workpiece, the fluid, the heat exchangers, the pipes to carry the fluid, and the cooling channels through different operating conditions of the process recipe. The physical model may be established for two or more zones. For systems with multiple zones of cooling channels in the chuck (or any other component), the model may consider the cross talk between the two or more zones. The cross talk considers heat transfer between the cooling zones that are affected by the different coolant channels. In some embodiments, a model-based controller design uses a linear quadratic controller or a similar optimizing controller designed to handle the cross talk and control temperature ramp rates.

The temperature ramp rates may be used to improve ESC reliability, for example the bonding life time. Temperature ramp rate control also helps with matching processes between different processing chambers that have different thermal characteristics. Control over the temperature ramp rate also helps to improve the process window for HARC (High Aspect Ratio Contact) etching and other processes that require high precision.

Figure 6:
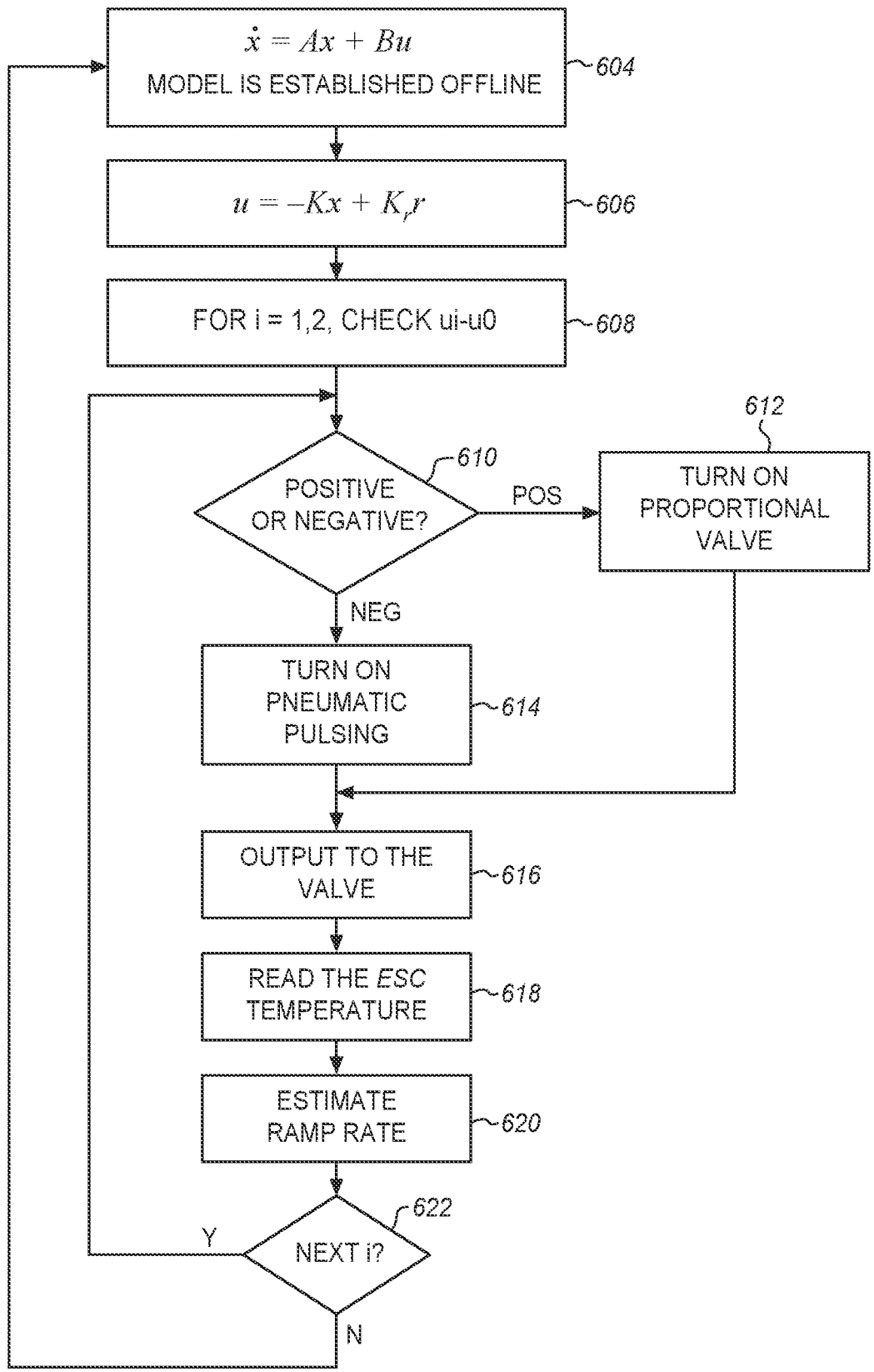
FIG. 6 is a process flow diagram of a model-based control loop that may be used to control the temperature of a component using a water interface box in accordance with an embodiment of the present invention.

FIG. 6 is a process flow diagram of a model-based control loop that may be used to control the temperature of a component within a processing chamber using a coolant and at least one control valve. This process may use the hybrid two-valve system described above or any other desired flow control system. The model may be established empirically or theoretically before processing begins. The model may be a dynamic linear model that represents the behavior of the temperature-controlled component in the plasma chamber under different conditions. Using a predictive model, the future behavior of the component, such as the ESC shown above, may be predicted. This allows temperature ramp rates to also be controlled. Using the processing recipe as an input, the controlled temperature may be adjusted in advance of temperature loads or changes in desired temperature set points.

Box 604 is a representation of the application of a linear predictive control system using the model as an ordinary differential equation stated in this example as:

$$\dot{x} = Ax + Bu,$$

where A and B are matrices derived from the model. For a two zone system, the matrices are 4×4 matrices. For more zones the matrix is expanded accordingly. Other models may be used, depending on the particular implementation and non-linear models may also be used.

In this example, $\dot{x}$ is a linear array or 1×4 matrix which is defined for a two zone system as $\dot{x} = [x_1, x_2, x_3, x_4]$. This may be expanded to accommodate more zones. The two different zones are treated in the same model to accommodate cross talk between the temperatures of the zones. In the example of an ESC (Electrostatic Chuck) the variables in the array may be assigned the following values:

$x_1$=ESC inner zone temperature
$x_2$=ESC outer zone temperature
$x_3$=ESC inner zone temperature ramp rate
$x_4$=ESC outer zone temperature ramp rate
$u = [u_1, u_2]$ and represents the control output that is used to adjust the valves for each zone. In this example, the adjustment is stated as a percentage of valve opening or percentage of the total maximum flow through the valve. The specific values will depend on the values used to determine the model, but are stated here as:
$u_1$=inner zone valve percentage
$u_2$=outer zone valve percentage At box 606 the values for each u may be determined as:

$$u = -Kx + K_r r$$

where K and $K_r$ are constants to reflect the controller gain. These may vary by time based on learning and are initially determined by the model for each u (i.e. $u_1$, $u_2$). r is the temperature set points, i.e. the temperature that the system is trying to achieve at the ESC by adjusting the valves as defined by u above. The set points in this example are as follows:

$r_1$=ESC inner zone temperature set point
$r_2$=ESC outer zone temperature set point
$r_3$=ESC inner zone temperature ramp rate set point
$r_4$=ESC outer zone temperature ramp rate set point After the operations of box 606, the intended adjustments of the valves have been determined that will achieve the desired temperature and ramp rate set points. The process may then translate these values for $u_1$, $u_2$ into valve actuations, such as electrical control signals to turn on the proportional valve 612 or pneumatic control signals 614 to turn on the pneumatic valve. Box 608 shows an example of operations for a two-valve hybrid system as described above.

The operations are performed for each zone valve percentage u (i.e. $u_1$, $u_2$) or for i=1,2, check $u_i$-u0. u0 represents a minimum threshold value for a proportional valve percentage e.g. 10%.

If the result positive, i.e. the proportional valve is to be set at over 10% open, then at 612 the corresponding proportional valve is set to the calculated value $u_i$ %. On the other hand if the result is negative, i.e. the proportional valve is to be set to less than 10% open, then at 614 the proportional valve is set to some low value, such as 10% and pneumatic pulsing is applied at the pneumatic valve. This may be applied as first setting the pulsing at some duty cycle of $p_i$ % (usually between 20% to 80%, depending on the characteristics of the valve) and second as setting the proportional valve at $(u_i/p_i)$ %. This allows the proportional valve to supply the rest of the flow control above the best operational range for the pulsing valve.

The operation of box 608 may alternatively be described as follows. The temperature controller first determines a total flow rate for each thermal zone. This total flow rate is then compared to a threshold, defined above as u0. If the total flow rate, indicated as $u_1$ or $u_2$ above, is above the threshold, then the temperature controller opens the pneumatic valve and modulates the proportional valve to obtain the desired flow rate. On the other hand if the total flow rate is below the threshold, then the temperature controller closes the proportional valve to a pre-determined flow rate and modulates the pneumatic valve to obtain the desired total flow rate. With the valves in series, the restriction of the first valve is combined with the restriction of the second valve to obtain the overall restricted flow.

At box 616, the determined valve control values are output to the valves. As mentioned above, these may be a direct flow percentage u (i.e. $u_1$, $u_2$) in the case of a single valve system from box 606 or the control may be more complex for a multiple valve system such as in optional box 608. Valve control values may be determined in other ways, not shown in box 608 depending on the particular implementation of the flow control system between the heat exchangers and the processing chamber component, such as an ESC.

In addition to controlling the flow through the valves, the input parameters are read at 618, namely the current zone temperatures $x_1$, $x_2$. The ramp rates $x_3$, $x_4$ may also be estimated at 620 using a derivative or time rate of change of the temperatures $x_1$, $x_2$. These values may then be used as inputs for another cycle of adjustment at box 604. Accordingly the control process of FIG. 6 is a closed loop control system as shown by the return loop 622 of FIG. 6.

The process of FIG. 6 may also be described as performing a sequence of operations at the MIMO controller, a temperature controller or some other component of the system. Measured temperatures are received both from a first thermal sensor of the first thermal zone and a second thermal sensor of a second thermal zone of the carrier. A predictive model is then applied to both of the measured temperatures to determine a first flow rate through a first fluid channel of the carrier that is thermally coupled to the first thermal zone and to determine a second flow rate through a second fluid channel of the carrier that is thermally coupled to the second thermal zone. Using these determined flow rates the controller modulates a first valve coupled to the first fluid channel and a second valve coupled to the second fluid channel to control a rate of flow of the thermal fluid from a heat exchanger to the respective fluid channels.

This method may also use ramp rates. Temperature ramp rates of the first and the second thermal zones are estimated using the received measured temperatures. The predictive model is then applied by applying the estimated temperature ramp rates.

Chamber Structure

Figure 7:
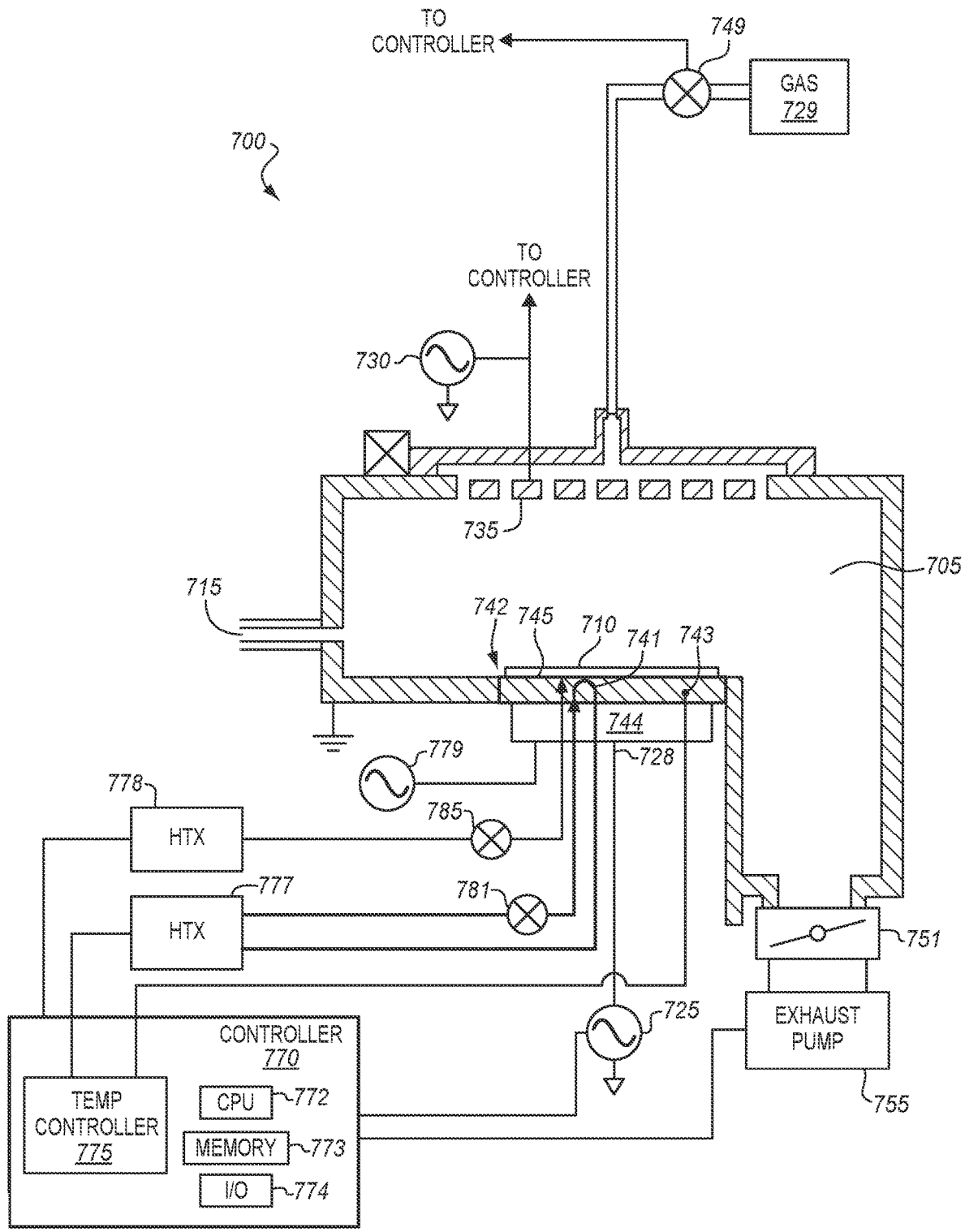
FIG. 7 is a schematic of a plasma etch system including a chuck assembly in accordance with an embodiment of the present invention.

FIG. 7 is a schematic of a plasma etch system 700 including a chuck assembly 742 in accordance with an embodiment of the present invention. The plasma etch system 700 may be any type of high performance etch chamber. Other commercially available etch chambers may similarly utilize the chuck assemblies described herein. While the exemplary embodiments are described in the context of the plasma etch system 700, the chuck assembly and temperature control systems described herein are also adaptable to other processing systems used to perform any plasma fabrication process (e.g., plasma deposition systems, etc.)

Referring to FIG. 7, the plasma etch system 700 includes a grounded chamber 705. Process gases are supplied from gas source(s) 729 connected to the chamber through a mass flow controller 749 to the interior of the chamber 705. Chamber 705 is evacuated via an exhaust valve 751 connected to a high capacity vacuum pump stack 755. When plasma power is applied to the chamber 705, a plasma is formed in a processing region over a workpiece 710. A plasma bias power 725 is coupled into a chuck assembly 742 to energize the plasma. The plasma bias power 725 typically has a low frequency between about 2 MHz to 60 MHz, and may be, for example, in the 13.56 MHz band.

In an example embodiment, the plasma etch system 700 includes a second plasma bias power operating at about the 2 MHz band which is connected to an RF match. The first plasma bias power 725 is also coupled to the RF match and also coupled to a lower electrode via a power conduit 728. A plasma source power 730 is coupled through another match (not shown) to a plasma generating element 735 to provide high frequency source power to inductively or capacitively energize the plasma. The plasma source power 730 may have a higher frequency than the plasma bias power 725, such as between 100 and 180 MHz, and may, for example, be in the 162 MHz band.

A workpiece 710 is loaded through an opening 715 and clamped to a chuck assembly 742 inside the chamber. The workpiece 710, such as a semiconductor wafer, may be any wafer, substrate, or other material employed in the semiconductor processing art and the present invention is not limited in this respect. The workpiece 710 is disposed on a top surface of a dielectric layer or puck 745 of the chuck assembly that is disposed over a cooling base assembly 744 of the chuck assembly. A clamp electrode (not shown) is embedded in the dielectric layer. It is coupled to source of bias power 779 to provide an electrostatic force to clamp the workpiece 710. In particular embodiments, the chuck assembly 742 may include two or more different fluid channel zones, such as an inner channel 741 and an outer channel. Each channel 741 may be independently controllable to the same or to different temperature set points.

A system controller 770 is coupled to a variety of different systems to control a fabrication process in the chamber. The controller 770 may include a temperature controller 775 to execute temperature control algorithms (e.g., temperature feedback control) and may be either software or hardware or a combination of both software and hardware. The system controller 770 also includes a central processing unit 772, memory 773 and input/output interface 774. The temperature controller 775 is to output control signals affecting the rate of heat transfer between the chuck assembly 742 and a heat source and/or heat sink external to the plasma chamber 705 for the various fluid channels. The temperature controller may be coupled to one or more temperature probes 743 which may be in or on the substrate carrier, coupled to fluid supply lines, or in any other desired location.

The thermal fluid zones may include separate, independently controlled thermal fluid heat transfer loops with separate flow control that is controlled based on a zone-specific temperature feedback loop as described above. In the example embodiment, the temperature controller 775 is coupled to a first heat exchanger (HTX)/chiller 777 and may further be coupled to a second HTX/heater 778 and more heat exchangers (not shown) as desired depending on the particular implementation. The flow rate of the heat transfer fluid or coolant through conduits in the chuck assembly 742 is controlled by a proportional valve system 781, 785 as described above.

The proportional valve system 781, 785 is controlled by the temperature controller 775 to independently control a rate of flow of the thermal fluid or heat transfer fluid to each of the different fluid channels. The temperature controller may also control the temperature set point used by each heat exchanger to cool or heat the thermal fluid. Accordingly, each heat exchanger may bring the thermal fluid for its respective coolant channel to a different temperature before providing it back to the fluid channels.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers. While the present description describes the ESC in the context of a plasma processing chamber, the ESC described herein may be used in a variety of different chambers and for a variety of different processes. A different substrate carrier may be used instead of an ESC, depending on the particular implementation.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A workpiece processing system, comprising:
    a plasma chamber;
    a plasma source to generate a plasma containing gas ions in the plasma chamber;
    a workpiece holder in the chamber to hold a workpiece during plasma processing and to control the temperature of the workpiece, the workpiece holder having a first fluid channel and a second fluid channel;
    a first flow line coupled to the first fluid channel of the workpiece holder, the first flow line comprising a first supply flow line and a first return flow line, the first return flow line coupled to only a single return manifold;
    a second flow line coupled to the second fluid channel of the workpiece holder, the second flow line comprising a second supply flow line and a second return flow line, the second return flow line coupled to only the single return manifold, the single return manifold coupled to a corresponding single heat exchanger, the single heat exchanger coupled to the first supply flow line and to the second supply flow line, wherein an entirety of an output of the first return flow line and the second return flow line is input into the single return manifold, and wherein the entirety of the output of the first return flow line and the second return flow line is the same as an entirety of an output of the first supply flow line and the second supply flow line;
    a first valve coupled to the first supply flow line, the first valve between the single return manifold and the workpiece holder;
    a second valve coupled to the second supply flow line, the second valve between the single return manifold and the workpiece holder;
    a first flow meter between the first valve and the single return manifold, the first flow meter in series with the first valve; and
    a second flow meter between the second valve and the single return manifold, the second flow meter in series with the second valve.

2. The workpiece processing system of claim 1, wherein the first and second flow meters are between the workpiece holder and the single return manifold.

3. The workpiece processing system of claim 1, wherein the first valve comprises a first pressure regulated valve and the second valve comprises a second pressure regulated valve.

4. The workpiece processing system of claim 3, further comprising:
    a first pressure regulator coupled to the first pressure regulated valve to control the first pressure regulated valve; and
    a second pressure regulator coupled to the second pressure regulated valve to control the second pressure regulated valve.

5. The workpiece processing system of claim 1, further comprising:
    a third valve between the single return manifold and the first valve; and
    a fourth valve between the single return manifold and the second valve.

6. The workpiece processing system of claim 1, further comprising:
    a temperature controller to receive a measured temperature from a thermal sensor of the workpiece holder and to control the first valve and the second valve in response to the measured temperature to adjust the rate of flow of a thermal fluid.

7. The workpiece processing system of claim 1, wherein the thermal fluid comprises polyethers.

* * * * *